(12) United States Patent
Marhold et al.

(10) Patent No.: US 8,318,038 B2
(45) Date of Patent: Nov. 27, 2012

(54) NONFLAMMABLE COMPOSITIONS COMPRISING FLUORINATED COMPOUNDS AND USE OF THESE COMPOSITIONS

(75) Inventors: Michael Marhold, Leverkusen (DE); Helge Rau, Burgdorf (DE); Karsten Börner, Sehnde (DE); Christoph Meurer, Hannover (DE)

(73) Assignee: SOLVAY FLUOR GmbH, Hannover (DE)

( * ) Notice: Subject to any disclaimer, the term of this patent is extended or adjusted under 35 U.S.C. 154(b) by 578 days.

(21) Appl. No.: 12/522,502

(22) PCT Filed: Feb. 4, 2008

(86) PCT No.: PCT/EP2008/051307
§ 371 (c)(1),
(2), (4) Date: Sep. 15, 2009

(87) PCT Pub. No.: WO2008/095881
PCT Pub. Date: Aug. 14, 2008

(65) Prior Publication Data
US 2010/0029531 A1    Feb. 4, 2010

(30) Foreign Application Priority Data

Feb. 6, 2007  (EP) ..................................... 07101826
Feb. 6, 2007  (EP) ..................................... 07101835

(51) Int. Cl.
*C09K 5/04* (2006.01)
(52) U.S. Cl. ................................ 252/67; 62/114; 252/70
(58) Field of Classification Search ........................ None
See application file for complete search history.

(56) References Cited

U.S. PATENT DOCUMENTS

| | | |
|---|---|---|
| 5,268,121 A | 12/1993 | Michaud |
| 5,445,757 A | 8/1995 | Pennetreau |
| 5,478,492 A | 12/1995 | Barthelemy et al. |
| 5,658,962 A | 8/1997 | Moore et al. |
| 5,714,298 A | 2/1998 | Barthelemy et al. |
| 5,750,797 A | 5/1998 | Vitcak et al. |
| 6,080,799 A | 6/2000 | Kruecke et al. |
| 6,660,709 B1 | 12/2003 | Dournel et al. |
| 6,743,765 B1 | 6/2004 | Dournel et al. |
| 7,022,253 B2 | 4/2006 | Dournel et al. |
| 7,189,339 B2 | 3/2007 | Dournel et al. |
| 7,517,845 B2 | 4/2009 | Dournel et al. |
| 2004/0192573 A1 | 9/2004 | Dournel et al. |
| 2004/0204330 A1 | 10/2004 | Dournel et al. |
| 2006/0266975 A1 | 11/2006 | Nappa et al. |
| 2007/0135326 A1 | 6/2007 | Dournel et al. |

FOREIGN PATENT DOCUMENTS

| | | |
|---|---|---|
| EP | 0512885 A1 | 11/1992 |
| EP | 0618288 A1 | 10/1994 |
| EP | 0653484 A1 | 5/1995 |
| EP | 1403361 A1 | 3/2004 |
| FR | 2287432 A | 5/1976 |
| JP | 05/168805 A | 7/1993 |
| JP | 05/171190 A | 7/1993 |
| WO | WO98/37163 A1 | 8/1998 |
| WO | WO99/35209 A1 | 7/1999 |
| WO | WO00/17301 A1 | 3/2000 |
| WO | WO 00/36046 A1 | 6/2000 |
| WO | WO02/099006 A1 | 12/2002 |
| WO | WO2005/118754 A2 | 12/2005 |

OTHER PUBLICATIONS

D.A. Didion et al.—"Role of refrigerant mixtures as alternatives to CFCs"—Int J. Refrigeration vol. 13 May 1990, p. 163-175 (13 pp.).
International Standard Organization, Standard DIN/EN/ISO 13736 "Petroleum products and other liquids—Determination of flash point—Abel closed cup method" Nov. 1, 1997 (24 pp.).

*Primary Examiner* — Necholus Ogden, Jr.
(74) *Attorney, Agent, or Firm* — Beatrice C. Ortego

(57) ABSTRACT

The invention relates to non-flammable compositions comprising fluorinated compounds selected from the group consisting of hydrofluoroalkanes, hydrofluoroalkenes, partially or perfluorinated aromatic compounds, hydrofluoroethers or fluoroketones, 1,2-dichloroethylene, especially trans-1,2-dichloroethylene, and a stabilizer. These non-flammable compositions which preferably contain 1,1,1,3,3-pentafluorobutane, can be used especially as solvents for cleaning and defluxing electronic components and for degreasing metals. The compositions further may comprise a propellant, e.g. 1,1,1,2-tetrafluoroethane. These compositions are especially suitable as flushing agent.

24 Claims, No Drawings

NONFLAMMABLE COMPOSITIONS COMPRISING FLUORINATED COMPOUNDS AND USE OF THESE COMPOSITIONS

CROSS-REFERENCE TO RELATED APPLICATIONS

This application is a U.S. national stage application under 35 U.S.C. §371 of International Application No. PCT/EP2008/051307 filed Feb. 4, 2008, which claims priority to European Application No. 07101826.1 filed Feb. 6, 2007, and to European Application No. 07101835.2 filed Feb. 6, 2007, all of these applications being herein incorporated by reference in their entirety for all purposes.

The invention relates to compositions comprising fluorinated compounds and to the use of these compositions, especially as cleaning and/or drying agents for solid surfaces and for flushing, especially of refrigeration apparatus.

Fully halogenated chlorofluorinated hydrocarbons (CFCs), in particular 1,1,2-trichloro-1,2,2-trifluoroethane (CFC-113), were widely used as solvents in industry for degreasing and cleaning various surfaces, particularly for solid components of complicated shape which are difficult to clean. In addition to their use in electronics in cleaning soldering fluxes in order to remove the pickling flux which adheres to printed circuits, they were also conventionally used for degreasing metal components or for cleaning mechanical components of high quality and of high precision. In these various applications, CFC-113 was most often used in combination with other organic solvents, preferably in the form of azeotropic or pseudoazeotropic compositions having substantially the same composition in the vapour phase and in the liquid phase, so that they could be easily employed at reflux. For example, CFC-113 was used in combination with trans-1,2-dichloroethylene in compositions formerly known as Freon® MCA and Freon® SMT. Such compositions could be used as cleaning agents in the refrigeration industry.

Compositions based on CFC-113 were also conventionally used as desiccating agents, in order to remove the water adsorbed at the surface of solid components.

However, CFC-113, as well as other fully halogenated chlorofluoroalkanes, was suspected of being involved in the destruction of the stratospheric ozone layer. Consequently, new compositions which do not have a harmful influence on the ozone layer were proposed, for example, a certain number of azeotropic compositions based on hydrofluoroalkanes. In particular, Patent Application EP-A-0,512,885 (ElfAtochem) proposes an azeotropic composition comprising, by weight, 93 to 99% of 1,1,1,3,3-pentafluorobutane (HFA-365mfc) and from 7 to 1% of methanol. The patent applications JP 5/168805 and JP/5/171190 describe cleaning compositions based on HFC-365mfc and trans-1,2-dichloroethylene in proportions for which they do not from an azeotrope. EP patent application EP-A-0 653484 discloses compositions comprising 1,1,1,3,3-pentafluorobutane, trans-1,2-dichloroethylene and optionally an alcohol with 1 to 3 carbon atoms. Both trans-1,2-dichloroethylene and alcohols with 1 to 3 carbon atoms are, per se, flammable.

U.S. Pat. No. 5,714,298 discloses toner fixing agents containing HFC-365mfc and, i.a., trans-1,2-dichloro-ethylene. It is stated in table II of that patent that a mixture consisting of 70% by weight of HFC-365mfc and 30% by weight of trans-1,2-dichloroethylene, has no closed cup flash point in the range of −30° C. to +40° C. Consequently, that statement made 1996 does not exclude the possibility that a flash point exists at a higher temperature than that tested in that example; especially if it is taken into consideration that, while at the time of filing of that patent, it was believed that HFC-365mfc was non-flammable. It was later considered flammable (see, for example, U.S. Pat. No. 6,080,799) even though it can be ignited only with difficulty because it needs a high ignition energy.

EP-A-0 618288 discloses compositions comprising HFC-365mfc and ethanol which are suitable as cleaning or degreasing agents.

One of the objectives of the present invention is to provide non-flammable compositions, optionally forming azeotropes or pseudoazeotropes, which are particularly effective when they are used as cleaning agents in solvent cleaning processes. Another object of the present invention is to provide compositions which are especially suitable as cleaning agents in the refrigeration industry, notably as flushing agents for cleaning air conditioning systems. A further subject of the invention is such compositions having properties particularly suited to cleaning printed circuit boards. The present invention consequently relates to non-flammable compositions comprising (a) a fluorinated compound selected from a hydrofluoroalkane, a hydrofluoroalkene, a fluorinated aromatic compound, a hydrofluoroether or a fluorinated ketone
(b) 1,2-dichloroethylene and
(c) an effective amount of a stabilizer of the fluorinated compound or the 1,2-dichloroethylene.

Optionally, a propellant can be present.

The term "comprising" includes the meaning "consisting of".

The term "flammable" is meant to denote any flammability determined according to any applicable standard, and is preferably defined in DIN/EN/ISO 13736.

The term "hydrofluoroalkane" denotes saturated compounds consisting of carbon, hydrogen and fluorine which can be aliphatic or alicyclic and preferably comprise 3 to 7 carbon atoms. Preferably, the number of fluorine atoms is equal to or higher than the number of hydrogen atoms. Compounds of general formula $C_aH_bF_c$ wherein a is an integer from 3 to 6, b is an integer from 1 to (a+1) and c is an integer from a to (a+2). Very preferably, a denotes an integer from 3 to 5. Especially preferred are pentafluoropropanes, for example, 1,1,1,3,3-pentafluoropropane (HFC-245fa), 1,1,2,2,3-pentafluoropropane (HFC-245ca), hexafluoropropanes, heptafluoropropanes, especially 1,1,1,2,3,3,3-heptafluoropropane, pentafluorobutanes, for example, 1,1,1,3,3-pentafluorobutane and 2-methyl-1,1,1,3,3-pentafluoropropane (HFC-365 mps), hexafluorobutanes, for example, 1,1,1,4,4,4-hexafluorobutane, and decafluoropentanes, for example 1,1,1,2,2,3,4,5,5,5-decafluoropentane (HFC-43-10-mee).

The term "hydrofluoroalkene" denotes compounds consisting of carbon, hydrogen and fluorine which can be aliphatic or alicyclic, comprise at least one C—C double bond and preferably comprise 3 to 7 carbon atoms. Preferably, the ratio of fluorine atoms to hydrogen atoms is higher than 2:1. Preferably, the term "hydrofluoroalkene" denotes aliphatic compounds with 1 or 2 C—C double bonds and 3 to 5 carbon atoms. Pentafluoropropene compounds are very suitable. The term "pentafluoropropene" includes cis-1,2,3,3,3-pentafluoropropene, trans-1,2,3,3,3-pentafluoropropene, 1,1,2,3,3-pentafluoropropene and 1,1,3,3,3-pentafluoropropene. These compounds can be prepared by hydrodechlorination of chloropentafluoropropane or dechlorination of dichloropentafluoropropane or by dehydrofluorination of hexafluoropropane, for example in the presence of a base or in the presence of a catalyst, e.g. aluminium fluoride.

The term "fluorinated aromatic compound" denotes compounds which are partially or fully fluorinated, have an aromatic ring and comprise 5 to 9 carbon atoms. 1 or 2 carbon atoms of the aromatic ring can be substituted by heteroatoms, especially nitrogen or oxygen. A preferred ring system is the benzene ring which can be substituted by 1 or more alkyl groups. The carbon atoms of the ring system and/or alkyl group substituents, if comprised, can be fluorinated.

The term "hydrofluoroether" denotes compounds which consist of carbon, hydrogen, fluorine and oxygen atoms; the oxygen atoms are catenary (i.e. in-chain) carbon atoms. Suitable hydrofluoroethers can be those which are denoted to be "segregated", and those which are denoted to be co-hydrofluoroalkylethers.

Segregated hydrofluoroalkylethers have the formula $R_f$—$(O—R_h)_x$ wherein $R_f$ is perfluorinated alkyl group, preferably a C1 to C4 perfluoroalkyl group, and $R_h$ is an alkyl or alkylene group, preferably a C1 to C3 alkyl or alkylene group, and x is an integer selected from 1, 2 or 3. Such hydrofluoroethers can be prepared as described in FR 2287432 or U.S. Pat. No. 5,750,797. Particular hydrofluoroethers are selected from perfluorobutyl-methyl ether (HFE449s1) and perfluorobutyl-ethyl ether (HFE569sf2).

ω-Hydrofluoroalkylethers have the formula X—$R'_f$—$(O—R_f)_y$—O—R"—H. In this formula, X is F or H, and y is an interger denoting 0, 1, 2, 3 and 4. $R'_f$ and $R_f$ are the same or different and are divalent perfluorinated organic radicals with 1 to 6 carbon atoms, and R" is a divalent organic radical with 1 to 6 carbon atoms and is preferably perfluorinated. The preparation of such compounds is known and is described in U.S. Pat. No. 5,658,962.

According to a preferred embodiment, the hydrofluoroethers have a boiling point between 40 and 121° C.

The term "fluoroketone" denotes compounds generally consisting of fluorine, carbon and oxygen wherein the oxygen is comprised at least partially in the form of a C—O group. Fluoroketones of general formula $R^1$—C(O)$R^2$ wherein $R^1$ and $R^2$ are aliphatic or alicyclic C1 to C4 groups which are the same or different and are partially fluorinated or perfluorinated, are preferred. Especially preferred are fluoroketones with at most 2 hydrogen atoms in the molecule. For example, 1,1,1,2,2,4,5,5,5-nonafluoro-4-(trifluoromethyl)-3-pentanone can be applied.

Preferably, hydrochlorofluorocarbons are not comprised in the compositions, i.e. the compositions are free of hydrofluorochlorocarbons.

Hydrofluorocarbons are preferred compounds (a) of the present invention. In a preferred embodiment, hydrofluorocarbons are the only compound (a) in the composition. In a very preferred embodiment, C3 and/or C4 hydrofluorocarbons are comprised; especially preferably, a C3 or C4 hydrofluorocarbon is the only compound (a) in the composition. 1,1,1,3,3-pentafluoropropane and, especially preferably, 1,1,1,3,3-pentafluorobutane are very well suited. The invention will now be described in view of the most preferred embodiment wherein 1,1,1,3,3-pentafluorobutane is contained as compound (a).

1,2-Dichloroethylene exists in two isomeric forms, cis-1,2-dichloroethylene and trans-1,2-dichloroethylene. For the purposes of the present invention, 1,2-dichloroethylene is understood to mean, without distinction, one or the other isomer or a mixture of these. Nevertheless, trans-1,2-dichloroethylene is the preferred isomer.

The hydrofluorocarbon and 1,2-dichloroethylene contents in the compositions according to the invention can vary within wide limits, depending on the use envisaged; especially because compositions containing even 95% by weight of trans-1,2-dichloroethylene and nearly 0.5% by weight of isopropanol, just as compositions comprising only 5% by weight of trans-1,2-dichloroethylene have no flash point. Thus, non-flammable compositions according to the present invention can comprise HFC-365mfc and trans-1,2-dichloroethylene (TDCE) within broad ranges. For example, compositions according to the present invention can comprise HFC-365mfc in an amount equal to or higher than 1.5%, preferably equal to or higher than 4.5% by weight. Likewise, compositions according to the present invention can comprise TDCE in an amount of equal to or higher than 1.5%, preferably equal to or higher than 4.5% by weight. They can comprise HFC-365mfc in an amount of equal to or lower than 98%, preferably equal to or lower than 95% by weight, and TDCE in an amount equal to or lower than 98%, preferably equal to or lower than 95% by weight, preferably equal to or lower than 97.5% by weight. Additionally they comprise a stabilizer preferably in an amount from >0% by weight up to 0.5% by weight. A preferred stabilizer, as indicated below, is isopropanol.

Preferred compositions according to the invention often contain equal to or more than 45% by weight of hydrofluorocarbon. They advantageously contain equal to or more than 50% by weight thereof. In a particularly preferred way, they contain equal to or more than 60% thereof. They can contain up to 90% by weight thereof. Most often, they contain equal to or less than 85% by weight thereof. In a very preferred embodiment, the hydrofluorocarbon is 1,1,1,3,3-pentafluorobutane which is comprised in the amounts given.

Preferred compositions according to the invention often contain from 9.5 to 54.5% by weight of 1,2-dichloroethylene. They preferably contain from 14.5 to 49.5% thereof.

The compositions according to the invention, as mentioned above, additionally contain a stabilizer. The stabilizer is intended to stabilize the components of the composition against undesired side reactions during storage, transportation or use. For example, stabilizers may protect components against oxidation. The preferred compounds (a) of the composition, the hydrofluorocarbons, can be stabilized against degradation, for example by elimination of HF, and the 1,2-dichloroethylene can be stabilized against polymerization. Stabilizing compounds can be non-flammable, but often, they are flammable.

Compounds that can be contained as stabilizer for the hydrofluoroalkane are for example, chosen from epoxides, unsaturated hydrocarbons, nitroalkanes, diketones, brominated compounds, and alcohols.

Preferred epoxides are 1,2-epoxypropane, 1,2-epoxybutane, 1,2-epoxypentane, 1,2-epoxyethylbenzene, epichlorohydrin and epicerol. Preferred unsaturated compounds are propenes, butenes, methylbutenes, dimethylbutenes, pentenes, methylpentenes, dimethylpentenes, trimethylpentenes, hexenes, cyclopentene, cyclohexene and methylcyclopentene, especially 2-methylbut-2-ene which sometime may contain a little 2-methyl-but-1-ene. Preferred nitroalkanes are C1 to C6 nitroalkanes, for example, nitromethane, nitroethane, 1-nitropropane, 2-nitropropane, 1-nitrobutane, 1-nitropentane and 1-nitrohexane. Preferred diketones, especially β-diketones, are C5 to C10 aliphatic ketones and benzochinones substituted by at least one C1 to C10 alkyl group. Acetylacetone, 1,4-benzochinone, tetrahydro-1,4-benzochinone, 2-chloro-1,4-benzochinone, and 1,4-benzochinone, substituted by one or more C1 to C5 alkyl groups. Preferred brominated compounds are bromoalkanes and bromoalkohols. Preferred alcohols are C1 to C5 alkanols, especially those which are not substituted by halogen atoms, for example, methanol, ethanol, propanol, isopropanol, butanol, isobutanol.

Very preferably, the composition according to the present invention comprises a nitroalkane, especially a C1 to C3 nitroalkane, or an alcohol, especially a C3 to C5 alcohol, as stabilizer. Most preferably, the composition comprises nitromethane or isopropanol as stabilizer. Alkanols, especially isopropanol, have the advantage that they stabilize both hydrofluoroalkanes and 1,2-dichloroethylene.

The stabilizer is comprised in the non-flammable composition in an effective amount to inhibit polymerization, oxidation or degradation of the hydrofluorocarbons or the 1,2-dichloroethylene, preferably trans-1,2-dichloroethylene. The effective amount can vary depending on the content of the hydrofluorocarbons and 1,2-dichloroethylene, intended purpose of the composition or content of compounds which cause the instability of the compounds against degradation or polymerisation and in view of the requirement of non-flammability of the compositions.

In particular, the stabilizer inhibits polymerization or degradation in the presence of acids or bases, especially of Lewis acids or Lewis bases. Among Lewis acids, mention shall be made of metals salts, especially the halides. Lewis acids the influence of which is intended to be prohibited are especially salts of aluminium, iron, magnesium, zinc, silicon, manganese, vanadium, chromium, tungsten and titanium, very often in the form of halide salts, e.g. the chlorides. Iron chloride often is a predominant Lewis acid. Such metal salts, especially iron halide, can be contained in the composition in an amount of, for example, 1 to 500 mg/kg. Without wishing to be bound by any theory, it is also believed that degradation can take place when unstabilized compositions containing 1,2-dichloroethylene are contacted even with metals such as the metal salt forming metals cited here before.

Generally, the content of the stabilizer is >0. Often, it is equal to or higher than 0.05% by weight, preferably equal to or higher than 0.10% by weight of the composition, still more preferably equal to or higher than 0.12% by weight of the composition. Generally, the content of the stabilizer is equal to or less than 0.5% by weight of the composition. Preferably, it is less than 0.5% by weight of the composition, still more preferably it is equal to or less than 0.4% by weight, especially it is equal to or less than 0.3% by weight of the composition.

Preferred compositions according to the invention are those which contain a hydrofluorocarbon, especially 1,1,1,3,3-pentafluorobutane, 1,2-dichloroethylene, especially trans-1,2-dichloroethylene, and the stabilizer in proportions in which they form an azeotrope or a pseudo-azeotrope. For such compositions, the stabilizer is contained in the liquid phase and in the vapour phase which means that the stabilizer is effective throughout use, especially when the use comprises the transfer of the composition into the vapour phase and optionally back into the liquid phase. This advantage will be explained later.

Fundamentally the thermodynamic state of a fluid is defined by four interdependent variables: the pressure (P), the temperature (T), the composition of the liquid phase (X) and the composition of the gas phase (Y). An azeotrope is a specific system containing at least two components in which, at a given temperature and a given pressure, X is exactly equal to Y. A pseudo-azeotrope is a system containing at least two components in which, at a given temperature and a given pressure, X is substantially equal to Y. In practice, this means that the constituents of such azeotropic or pseudo-azeotropic systems cannot be easily separated by distillation and consequently their composition remains substantially constant in solvent cleaning operations, as well as in operations for recovering spent solvents by distillation.

For the purposes of the present invention, the term "pseudo-azeotrope" in the frame of the present invention, for compositions which form no azeotrope, denotes a composition of which, after evaporation at a constant temperature of 50% of the initial liquid mass, the percent variation of the vapor pressure between that of the initial mixture and that of the final mixture resulting is lower than about 10%. See on the matter the paper of D. A. Didion and D. B. Bivens in Int. J. of Refrigeration 13 (1990), pages 163 to 175.

For the purposes of the present invention, for mixtures which form an azeotrope, the term "pseudo-azeotrope" is understood to mean a mixture of two or a number of constituents whose boiling point (at a given pressure) differs from the boiling point of the azeotrope by at most 0.2° C.

As mentioned above, isopropanol is a very preferred stabilizer.

It has been found, for example, that non-flammable compositions of 1,1,1,3,3-Pentafluorobutane, trans-1,2-dichloroethylene and isopropanol form a ternary pseudo-azeotrope, when their mixture consists essentially of 55.5% to 81.5% by weight of 1,1,1,3,3-pentafluorobutane, 44 to 18% by weight of trans-1,2-dichloroethylene and from >0 and equal to or preferably less than 0.5% by weight of isopropanol. A preferred composition forming a pseudo-azeotrope consists of 59.5 to 77.5% by weight of 1,1,1,3,3-pentafluorobutane, 40 to 22% by weight of trans-1,2-dichloroethylene and from >0 and equal to or preferably less than 0.5% by weight of isopropanol. Very preferred compositions consist essentially of 59.6 to 77.5% by weight 1,1,1,3,3-pentafluorobutane, 40 to 22.1% by weight of trans-1,2-dichloroethylene and from >0 to 0.4% by weight of isopropanol. Preferably, isopropanol is comprised in these mixtures in an amount of equal to or greater than 0.05% by weight, more preferably in an amount of equal to or greater than 0.1% by weight of the composition.

For the ternary compositions comprising isopropanol, it has been found that the composition of the vapour phase essentially corresponds to the composition in the liquid phase. Accordingly, isopropanol enters the vapour phase and continues to function as a stabilizer. While it is surprising, as explained above that a composition of HFC-365mfc and trans-1,2-dichloroethylene is non-flammable, it is still more surprising that even compositions which comprise in addition isopropanol, a very flammable compound, still are non-flammable. The boiling point of non-flammable compositions comprising 70.9% by weight of HFC-365mfc, 30.9% by weight of trans-1,2-dichloroethylene and 0.16% by weight of isopropanol remains constant at 35.7° C. Mixtures comprising 65.5 to 74.5% by weight of HFC-365mfc, >0 to 0.5% by weight of isopropanol and 25 to 34% by weight of TDCE are very suitable for cleaning processes, and, if they additionally comprise a propellant, are further especially suitable for flushing.

The finding that compositions comprising HFC-365mfc and trans-1,2-dichloroethylene in a broad range in the presence even of isopropanol, are non-flammable makes these mixtures especially valuable in the method of the present invention. It can for example be used in applications in which the initial content of HFC-365mfc and 1,2-trans-dichloroethylene, respectively, is shifted from a starting concentration to any concentration between 2 and 98% by weight.

In one embodiment, the invention concerns non-flammable compositions which further include a propellant. This embodiment concerns non-flammable compositions comprising A) a non-flammable basic composition comprising
- (a) a fluorinated compound selected from a hydrofluoroalkane, a hydrofluoroalkene, a fluorinated aromatic compound or a hydrofluoroether or a fluorinated ketone
- (b) 1,2-dichloroethylene
- (c) an effective amount of a stabilizer of the fluorinated compound or the 1,2-dichloroethylene, and B) a propellant.

Here, the basic composition A) corresponds to the composition described in further detail above. Preferred embodiments of that basic composition correspond to the embodiments denoted to be preferred embodiments of the composition mentioned above, especially in view of preferred fluorinated compounds, the preferred isomer of 1,2-dichloroethylene, stabilizer, and ranges thereof. The compositions comprising a propellant are especially suitable for cleaning refrigeration apparatus, especially climatisation apparatus, e.g. for flushing or cleaning automobile air conditioning.

The propellant assists in the delivery of the composition to the items to be treated, e.g. for flushing climatisation apparatus. Representative propellants comprise air, nitrogen, carbon dioxide, difluoromethane, trifluoromethane, fluorinated ethanes, especially 1,1-difluoroethane, 1,1,1-trifluoroethane, 1,1,2-trifluoroethane, 1,1,1,2-tetrafluoroethane, 1,1,2,2-tetrafluoroethane, and pentafluoroethane. Non-flammable propellants are preferred. 1,1,1,2-tetrafluoroethane (HFC-134a) is especially preferred. The propellant may be included in the composition in an amount of >0, preferably equal to or more than 5 parts, more preferably equal to or more than 10 parts by weight per 100 parts by weight of the sum of the constituents of the basic composition. Preferably, the amount of the propellant is equal to or less than 40 parts, preferably equal to or less than 30 parts by weight per 100 parts by weight of the sum of the other constituents of the basic composition. Compositions wherein the propellant is comprised in an amount of 1 to 25 parts per 100 parts of the basic composition are especially suitable for flushing.

Preferably, the propellant is no hydrochlorofluorocarbon.

The compositions, with or without a propellant, according to the invention have a suitable boiling point for replacing compositions based on CFC-113 in existing cleaning equipment. As regards its impact on the environment, 1,1,1,3,3-pentafluorobutane appears particularly advantageous, since it has no ozone depletion potential for ozone. The compositions according to the invention are additionally inert towards the various types of surfaces to be treated, whether they are metal, plastic or glass.

The compositions according to the invention can consequently be used in the same applications and according to the same techniques as the prior compositions based on CFC-113.

The compositions can be used, for example, as cleaning agents in general, especially as surface cleaning agent, e.g. for cleaning parts, for example, precision parts, made of plastics or inorganic material. The term "cleaning" includes, for example, cleaning textiles, degreasing in general, for example, degreasing animal hides, surface cleaning, for example cleaning, especially degreasing of metal, glass, or ceramics parts; for example, cleaning of optical lenses, cleaning of electronic devices, e.g. printed circuit boards contaminated by a pickling flux and residues from this flux, or cleaning solid chemicals insoluble in the composition. For example, small particles with a size of less than $10^{-3}$ m, micro particles with a size of less than $10^{-6}$ m and nano particles with a size of less than $10^{-9}$ m, of carbon or inorganic compounds can be treated. Solid objects can be desiccated to remove the water adsorbed at the surface of solid objects.

The use of the compositions, especially as degreasing agent for solid surfaces, includes the composition being in the vapour state when applied. For example, degreasing complicated metal parts which have been greased on the surface against corrosion or with drawing wax, drawing grease or drawing oil during shaping often is performed in a vapour degreaser. In such a vapour degreaser, the parts are positioned in a space above the liquid composition which is heated so that part of it is vaporized and condenses on the metal parts. The condensed liquid removes the grease. The vapour of the compositions according to the invention, especially of those which, unexpectedly, form azeotropes or pseudo-azeotropes, contains the stabilizer; accordingly, the compositions are not only stabilized when being in the liquid state, but also when being in the vapour state. Consequently, they are stabilized throughout the use including when the composition according to the invention is in contact with the metal part. The metal part contains preferably a metal such as described above and in particular a metal selected from aluminium, iron, magnesium, zinc, silicon, manganese, vanadium, chromium, tungsten and titanium. For example, isopropanol is present in the liquid composition, is contained in the vapour, condenses on the solid subject to be degreased or dewatered; it will also be present should the composition after repeated use be distilled for reuse; thus, the stabilizer is present in the liquid composition after its use and even after its reconditioning for reuse. The compositions according to the present invention can also be applied as solvents, for example, as solvent for chemical reactions or as a carrier fluid for transporting dissolved compounds, including their use as carrier for chromatographic purposes, or as solvent for chemicals ready to use, e.g. lacquers or paints. They also can be used as mold-release agents or for defluxing electronic components and for degreasing metals.

The invention consequently also relates to the use of the compositions according to the invention as cleaning agents, as degreasing agents for solid surfaces, as cleaning agents for printed circuit boards contaminated by a pickling flux and residues from this flux, or as desiccating agents for removing the water adsorbed at the surface of solid objects.

Especially the compositions with propellant, in view of the finding that the basic compositions comprising HFC-365mfc and trans-1,2-dichloroethylene in a broad range in the presence even of isopropanol or another alcohol, are non-flammable, makes the resulting compositions (including the basic composition and a propellant which is preferably non-flammable) especially valuable in a preferred method of the present invention which concerns flushing of refrigeration or climatisation equipment. It can for example be used even if the initial content of HFC-365mfc and trans-1,2-dichloroethylene, respectively, would be shifted from a starting concentration to any concentration between 2 and 98% by weight or 5 and 95% by weight.

The propellant-containing compositions can be used, for example, as cleaning agents in general, especially as surface cleaning agent, e.g. for cleaning parts, for example, precision parts, made of metal, plastics or inorganic material. The term "cleaning" includes, for example, cleaning textiles, degreasing in general, for example, degreasing animal hides, surface cleaning, for example cleaning, especially degreasing of metal, glass, or ceramics parts; for example, cleaning of optical lenses, cleaning of electronic devices, e.g. printed circuit boards contaminated by a pickling flux and residues from this flux, cleaning solid chemicals insoluble in the composition, e.g. nano particles of carbon or inorganic compounds, or desiccating solid objects for removing the water adsorbed at the surface of solid objects. They also can be used as mold-release agents, as blowing agents for preparing foamed plastics or as a propellant/solvent for spraying fluids or as a propellant/dispersant for solids.

Preferably, the propellant-containing compositions are used for flushing of refrigeration equipment. The interior surface of compression refrigeration equipment, for example, used for climatisation of rooms, space for storing goods, or automobiles (mobile air conditioning, MAC) sometimes needs cleaning from residues, for example, when the refrigerant has to be changed, or had evaporated because of a leakage or has to be removed for repair. The residue be located in lines or other parts of the apparatus, e.g. in the compressor. The residue comprises refrigerant, compressor lubricant, e.g. mineral oil, naphthenes or polyol ethers, metal particles or rust. By contact with the composition according to the present invention, the inner surface of the equipment is recovered substantially free of residue. The way of contacting is not critical. The composition preferably is flushed in liquid phase through the equipment. The vapour pressure of the propellant moves the composition through the equipment. Consequently, a method for flushing refrigeration equipment is also an embodiment of the present invention. The method comprises contacting the equipment with a composition according to the invention, and recovering the interior surface of the equipment substantially free of residues.

The compositions including the propellant-containing compositions according to the present invention can also be applied as solvents, for example, as solvent for chemical reactions or as a carrier fluid for transporting dissolved compounds, including their use as carrier for chromatographic purposes, or as solvent for chemicals ready to use, e.g. lacquers or paints, or as mold-release agent. They even can be applied as blowing agents for preparing plastic foams or for spraying liquids.

The compositions, with or without a propellant, can be prepared in a very simple manner by mixing the constituents. Constituents which are gaseous at ambient pressure and temperature can be added in liquid form under pressure or by adding them to the other constituents under condensation.

The invention advantageously provides compositions which are non-flammable, despite a content of 1,2-dichloroethylene which per se is flammable. Unexpectedly, even compositions comprising HFC-365mfc, 1,2-dichloroethylene and flammable stabilizers, for example, isopropanol, are non-flammable even though these compounds have a flash point. Another surprising advantage of such compositions is their property to form azeotropes or pseudo-azeotropes. The consequence is that on one hand, the stabilizer continues to stabilize the compositions also in the vapour phase. The other advantage of the compositions which form azeotropes and pseudo-azeotropes is that both distillate and residue show no great changes in their composition with the result that the composition is not shifted into a flammable range. Further, even after partial distillation, the compositions both of the residue and of the respective distillate comprise stabilizer and retain their properties in view of the intended use, e.g. their capability to degrease, to dewater, to solve etc.

Another advantage of the compositions according to the invention is that precautions against the hazard of flammability or explosion need not be taken. Further, there is no need to label storage tanks with signs or warnings against those risks.

The examples below, without implied limitation, illustrate the invention in a more detailed way.

EXAMPLES

Example 1

Preparation of a Composition Containing 1,1,1,3,3-Pentafluorobutane (HFC-365mfc), trans-1,2-Dichloroethylene (TDCE) and Isopropanol as a Stabilizer Trans-1,2-dichoroethylene which contained around 0.5% by weight of isopropanol was mixed with 1,1,1,3,3-pentafluorobutane in a weight ratio of 30:70. The resulting mixture contained 68.99% by weight of HFC-365mfc, 30.86% by weight of TDCE and 0.16% by weight of isopropanol (the difference of 0.01% by weight to 100% by weight is a result of rounding).

Flammability test with the mixture of example 1:

The flammability test was performed according to DIN/EN/ISO 13736 in a closed cup of 75 ml inner volume. The cup also comprises a stirrer and a probe to determine the temperature of the liquid to be tested, and means to rise the temperature. In the lid of the cup, a device is contained which allows to direct a test flame to the surface of the liquid the combustibility of which has to be determined. The apparatus used had a thermo detector which responds to fast rise of the measured temperature (indicating that a flame occurred).

The stirrer rotated slowly (about 30 rpm). The liquid in the cup was slowly warmed up. Whenever the temperature rose by 0.5° C., the test flame was ignited and it was checked if the thermo sensor responded. If yes, a process of combustion in the gas phase above the liquid had occurred.

Example 1.1

Mixture of Example 1

For the composition of example 1, no flash point was observed according to DIN/EN/ISO 13736.

By mixing HFC-365mfc with 1,2-trans-dichloroethylene which comprised about 0.5% by weight of isopropanol as stabilizer, further compositions were prepared and tested. The mixing ratios of HFC-365mfc and isopropanol-stabilized 1,2-trans-dichloroethylene (TDCE) and the test results are compiled in the following table (amounts given in parts by weight):

TABLE I

| Example | HFC-365mfc | Isopropanol-stab. TDCE | Result |
| --- | --- | --- | --- |
| 1.2 | 95 | 5 | No flashpoint |
| 1.2a | 95 | 5 | No flashpoint |
| 1.3 | 80 | 20 | No flashpoint |
| 1.3a | 80 | 20 | No flashpoint |
| 1.4 | 72 | 28 | No flashpoint |
| 1.4a | 72 | 28 | No flashpoint |
| 1.5 | 60 | 40 | No flashpoint |
| 1.5a | 60 | 40 | No flashpoint |
| 1.6 | 68 | 32 | No flashpoint |

The examples denoted as "a" were trials repeating the preceding test with the same mixing ratio to confirm the respective result.

Determination of Thermodynamic Properties:

The composition of example 1 was subjected to a distillation at atmospheric pressure using a Vigreux column. The boiling temperature remained constantly equal to 35.7° C. After 50% by weight of the composition had been distilled, the composition of the distillate and the residual composition in the distillation vessel was analysed by gas phase chromatography. The results obtained are collated in Table I.

TABLE II

| Fraction of the distillate | HFC-365mfc (weight %) | TDCE (weight %) | Isopropanol (weight %) |
| --- | --- | --- | --- |
| Distillate | 68.59 | 31.29 | 0.12 |
| Residue | 70.99 | 28.82 | 0.19 |

The composition of the distillate and residue in the vessel obtained showed the existence of a pseudo-azeotropic behaviour of the composition consisting of 1,1,1,3,3-pentafluorobutane, trans-1,2-dichloroethylene and isopropanol. The determination of the composition of the distillate and the residue also showed that the vapour phase comprises all three compounds which are flammable per se, but non-flammable as composition. It also showed that an effective stabilizing amount of isopropanol is present in the vapour of the composition.

Example 2

Preparation of a Mixture Containing 1,1,1,3,3-pentafluorobutane (HFC-365mfc), trans-1,2-dichloroethylene (TDCE) and Nitromethane as a Stabilizer Trans-1,2-dichoroethylene is mixed with 1,1,1,3,3-pentafluorobutane in a weight ratio of 30:70. Nitromethane is added so that the resulting mixture contains 68.85% by weight of HFC-365mfc, 29.85% by weight of TDCE and 0.3% by weight of nitromethane.

Example 3

Use of the Composition of Example 1 for Vapour Decreasing

Metal parts can be greased on the surface to protect them against corrosion. Adhering grease can also be caused by the application of drawing wax, drawing grease or drawing oil during shaping the metal parts. The step of cleaning high-precision metal parts is performed in a vapour degreaser.

A vapour immersion unit which has two solvent-filled sumps can be applied. A boil cleaning tank comprises a solvent mixture which, additional to a higher-boiling solvent component additionally comprises the non-flammable composition described above. A rinsing tank only comprises the non-flammable composition described above.

The metal parts are assembled in a basket and immersed into the boil cleaning tank to dissolve adhering grease. They are then removed and immersed into the rinsing tank wherein adhering solvent mixture from the boil cleaning tank is rinsed. The parts then are covered with the lower-boiling composition of the rinsing tank. The basket is then removed from the rinsing tank and kept in the gas space above tanks. The solvent adhering on the surface of the metal parts passes into the vapour phase. Near the top of the vapour degreaser are three sets of cooled coils where the vapour condenses before it can escape from the unit. The condensed vapour flows back to a clean condensate tank and can be reused. A part of the vapour is fed to a drying unit to remove water from it. The degreased dry metal parts can then be removed from the vapour degreaser.

Example 4

Comparison Example

To the composition of example 1, methanol was added so that the resulting mixture contained 3.6% by weight of methanol. A flash point was observed at −21.5° C.

Example 5

Preparation of a Flushing Composition Comprising an Isopropano-Stabilized Basic Composition By mixing, in a weight ratio of 70:30, of HFC-365mfc with 1,2-trans-dichloroethylene which comprised about 0.5% by weight of isopropanol as stabilizer, 142.4 g of the basic composition were prepared as in example 1. This basic composition was filled into a container, and 19.9 g of 1,1,1,2-tetrafluoroethane were condensed into the container. The resulting propellant-containing flushing composition had a pressure of 2.285 bar and was non-flammable.

Example 6

Preparation of a Composition Comprising an Isopropanol-Stabilized Basic Composition 5 kg of the basic composition of example 1 are filled into a storage tank and 1.25 kg of 1,1,1,2-tetrafluoroethane is condensed into the tank. After mixing, 6.25 kg of a flushing composition according to the present invention is obtained. The resulting composition comprises 20% by weight of HFC-134a. The composition is non-flammable.

Example 7

Preparation of a Composition Comprising an Isopropanol-Stabilized Basic Composition 5 kg of the basic composition of example 1 are filled into a storage tank and 1 kg of 1,1,1,2-tetrafluoroethane is condensed into the tank. After mixing, 6 kg of a flushing composition according to the present invention is obtained. The resulting composition comprises about 16.7% by weight of HFC-134a. The composition is non-flammable.

Example 8

Preparation of a Composition Comprising Nitromethane as Stabilizer 5 kg of the basic composition of example 2 are filled into a storage tank and 1 kg of 1,1,1,2-tetrafluoroethane are condensed into the tank. After mixing, 6 kg of a flushing composition according to the present invention is obtained. The composition is non-flammable.

Example 9

Flushing MAC Apparatus Using the Composition of the Present Invention

The composition prepared according to example 5 is applied in a method for flushing a mobile air conditioning apparatus.

The refrigerant is removed beforehand. A storage tank containing the composition is connected to the apparatus, and respective valves are opened. The composition is flushed through the lines and parts of the apparatus including the compressor. Residual oil and solids are removed during the treatment. The composition after leaving the apparatus is collected in a tank and can be conditioned for reuse by distillation. The flushed apparatus is clean and degreased and can be refilled with refrigerating agent.

The invention claimed is:

1. A nonflammable composition comprising
   (a) a fluorinated compound, wherein said fluorinated compound is 1,1,1,3,3-pentafluorobutane;
   (b) 1,2-dichloroethylene; and
   (c) a stabilizer of the fluorinated compound or the 1,2-dichloroethylene, wherein said stabilizer is isopropanol, and wherein the content of said stabilizer is greater than 0 and up to 0.5% by weight relative to the total weight of the composition.

2. The composition according to claim 1, wherein the content of stabilizer is from 0.05% by weight to 0.5% by weight relative to the total weight of the composition.

3. The composition according to claim 1, wherein the 1,2-dichloroethylene consists essentially of trans-1,2-dichloroethylene.

4. The composition according to claim 1 which is azeotropic or pseudo-azeotropic.

5. The composition according to claim 3 wherein the stabilizer is effective to inhibit polymerization or degradation of the fluorinated compound or the trans-1,2-dichloroethylene.

6. A non-flammable composition which comprises the non-flammable composition of claim 1 as basic composition and further comprises a propellant.

7. The composition according to claim 6 wherein the propellant is selected from the group consisting of air, nitrogen, carbon dioxide, difluoromethane, trifluoromethane, and fluorinated ethanes.

8. The composition according to claim 6 wherein the propellant is in an amount of from 1 to 25 parts by weight per 100 parts by weight of the basic composition.

9. The composition according to claim 2, wherein the content of stabilizer is from 0.1% by weight to 0.5% by weight relative to the total weight of the composition.

10. The composition according to claim 9, wherein the content of said stabilizer is from 0.12 to 0.3% by weight relative to the total weight of the composition.

11. A process for cleaning parts comprising a step of contacting parts to be cleaned with a cleaning agent, wherein the composition according to claim 1 is used as a cleaning agent.

12. The process of claim 11 wherein the composition is used as precision cleaning agent or as degreasing agent.

13. The process of claim 11, wherein the composition is in the vapor phase when it is contacted with the part to be cleaned.

14. A process for cleaning parts comprising a step of contacting printed circuit boards contaminated by a pickling flux and residues from this flux to be cleaned with a cleaning agent, or a step of desiccating solid objects with a desiccating agent for removing water adsorbed at the surface of said solid objects, wherein the composition according to claim 1 is used as said cleaning agent or said desiccating agent.

15. The process of claim 14 wherein the composition is used as a cleaning agent.

16. A process for cleaning of interior surfaces of refrigeration equipment comprising a step of contacting said interior surfaces with a cleaning agent wherein the composition according to claim 6 is used as cleaning agent.

17. The process of claim 16 wherein said interior surfaces are contacted with the cleaning agent by flushing.

18. The composition according to claim 1, comprising
   from 65.5 to 74.5% by weight of 1,1,1,3,3-pentafluorobutane;
   from 25 to 34% by weight of 1,2-dichloroethylene;
   greater than 0 and up to 0.5% by weight of isopropanol; and
   optionally, a propellant.

19. The composition according to claim 1, being a pseudo-azeotrope consisting of
   from 59.5 to 77.5% by weight of 1,1,1,3,3-pentafluorobutane;
   from 40 to 22% by weight of trans-1,2-dichloroethylene; and
   greater than 0 and up to 0.5% by weight of isopropanol.

20. The composition according to claim 1, consisting essentially of
   from 59.6 to 77.5% by weight of 1,1,1,3,3-pentafluorobutane;
   from 40 to 22.1% by weight of trans-1,2-dichloroethylene; and
   greater than 0 and up to 0.4% by weight of isopropanol.

21. The composition according to claim 6, comprising 1,1,1,2-tetrafluoroethane as propellant.

22. A nonflammable composition comprising
   (a) a fluorinated compound being 1,1,1,3,3-pentafluorobutane;
   (b) 1,2-dichloroethylene; and
   (c) a C1-C3 nitroalkane as stabilizer of the fluorinated compound or the 1,2-dichloroethylene, wherein the content of said stabilizer is greater than 0 and up to 0.5% by weight relative to the total weight of the composition.

23. The nonflammable composition according to claim 22, comprising nitromethane as stabilizer.

24. The composition according to claim 22, further comprising a propellant selected from the group consisting of air, nitrogen, carbon dioxide, difluoromethane, trifluoromethane, and fluorinated ethanes.

* * * * *